(12) United States Patent
Ascher et al.

(10) Patent No.: US 9,689,908 B2
(45) Date of Patent: Jun. 27, 2017

(54) METHOD FOR DETERMINING THE OPENING AND/OR CLOSING TIME OF THE NOZZLE NEEDLE OF AN INJECTION VALVE

(71) Applicant: Continental Automotive GmbH, Hannover (DE)

(72) Inventors: Stefan Ascher, Regensburg (DE); Hans-Joerg Wiehoff, Regensburg (DE)

(73) Assignee: CONTINENTAL AUTOMOTIVE GMBH, Hanover (DE)

( * ) Notice: Subject to any disclaimer, the term of this patent is extended or adjusted under 35 U.S.C. 154(b) by 50 days.

(21) Appl. No.: 14/787,536

(22) PCT Filed: Apr. 23, 2014

(86) PCT No.: PCT/EP2014/058185
§ 371 (c)(1),
(2) Date: Oct. 28, 2015

(87) PCT Pub. No.: WO2014/180655
PCT Pub. Date: Nov. 13, 2014

(65) Prior Publication Data
US 2016/0077141 A1    Mar. 17, 2016

(30) Foreign Application Priority Data

May 8, 2013    (DE) .......................... 10 2013 208 528

(51) Int. Cl.
*F02M 37/04* (2006.01)
*G01R 29/22* (2006.01)
(Continued)

(52) U.S. Cl.
CPC ......... *G01R 29/22* (2013.01); *F02D 41/2096* (2013.01); *F02D 41/221* (2013.01);
(Continued)

(58) Field of Classification Search
CPC .... F02D 41/20; F02D 41/401; F02D 41/2096; F02D 2200/0618; F02D 41/34; F02M 51/0603; F02M 41/123
(Continued)

(56) References Cited

U.S. PATENT DOCUMENTS 6,366,868 B2    4/2002   Freudenberg et al. ....... 702/115
7,146,269 B2   12/2006   Friedrich et al. ............. 701/114
(Continued)

FOREIGN PATENT DOCUMENTS

DE          19845042 A1    4/2000    ............. F02D 41/20
DE       102004012491 A1   10/2005    ............. F02D 41/20
(Continued)

OTHER PUBLICATIONS

Gallagher, Neal C. et al., "A Theoretical Analysis of the Properties of Median Filters," IEEE Transactions on Acoustics, Speech, and Signal Processing, vol. 29, No. 6, pp. 1136-1141 (6 pages total), Dec. 31, 1981.
(Continued)

*Primary Examiner* — John Kwon
(74) *Attorney, Agent, or Firm* — Slayden Grubert Beard PLLC

(57) ABSTRACT

A method is provided for determining the opening and/or closing time of the nozzle pin in an injection valve in an internal combustion engine having a plurality of cylinders. The nozzle pin is directly driven by a piezo actuator. The piezo voltage and/or the piezo charge at the respective piezo actuator functioning as a sensor is measured for the corresponding injection pulse in a plurality of cylinders of the internal combustion engine, and the median value of the measured voltage and/or charge values of the piezo actuators for the plurality of cylinders for the corresponding injection pulse is calculated. The obtained median value is then used
(Continued)

as a replacement value for determining the opening and/or closing time in case of non-detectability or disruption of the needle opening and/or needle closing information.

11 Claims, 2 Drawing Sheets

(51) Int. Cl.
| | | |
|---|---|---|
| *F02D 41/40* | (2006.01) | |
| *F02D 41/20* | (2006.01) | |
| *F02D 41/22* | (2006.01) | |
| *F02D 41/38* | (2006.01) | |
| *F02M 51/06* | (2006.01) | |
| *G01R 19/00* | (2006.01) | |
| *F02D 41/14* | (2006.01) | |

(52) U.S. Cl.
CPC ......... *F02D 41/3809* (2013.01); *F02D 41/40* (2013.01); *F02M 51/0603* (2013.01); *G01R 19/00* (2013.01); *F02D 2041/1418* (2013.01); *F02D 2041/1432* (2013.01); *F02D 2041/2051* (2013.01); *F02D 2041/2055* (2013.01); *Y02T 10/44* (2013.01)

(58) Field of Classification Search
USPC ........ 123/445, 480, 495, 498, 446; 701/103, 701/104, 105
See application file for complete search history.

(56) References Cited

U.S. PATENT DOCUMENTS

| | | | |
|---|---|---|---|
| 7,505,846 B2 | 3/2009 | Stoecklein et al. ........... 701/105 |
| 2002/0046734 A1* | 4/2002 | Rueger ............... F02D 41/2096 | 123/446 |
| 2007/0000303 A1* | 1/2007 | Sutter ................. F02D 41/2096 | 73/1.72 |
| 2007/0240685 A1* | 10/2007 | Beilharz ............. F02D 41/2096 | 123/498 |
| 2009/0065613 A1* | 3/2009 | Kondo ............... F02M 51/0603 | 239/533.12 |
| 2012/0013325 A1 | 1/2012 | Tonner et al. ................. 324/109 |
| 2015/0027415 A1* | 1/2015 | Radeczky ........... F02D 41/2096 | 123/480 |
| 2016/0298563 A1* | 10/2016 | Zhang ................ F02M 63/0026 |

FOREIGN PATENT DOCUMENTS

| | | | |
|---|---|---|---|
| DE | 102005002242 A1 | 7/2006 | ............. F02D 41/20 |
| DE | 102009000741 A1 | 8/2010 | ............. H01F 7/18 |
| DE | 102011075733 A1 | 11/2012 | ............. F02D 41/20 |
| WO | 2014/180655 A1 | 11/2014 | ............. F02D 41/22 |

OTHER PUBLICATIONS

German Office Action, Application No. 102013208528.1, 5 pages, Nov. 15, 2013.
International Search Report and Written Opinion, Application No. PCT/EP2014/058185, 13 pages, Oct. 7, 2014.

\* cited by examiner

METHOD FOR DETERMINING THE OPENING AND/OR CLOSING TIME OF THE NOZZLE NEEDLE OF AN INJECTION VALVE

CROSS-REFERENCE TO RELATED APPLICATIONS

This application is a U.S. National Stage Application of International Application No. PCT/EP2014/058185 filed Apr. 23, 2014, which designates the United States of America, and claims priority to DE Application No. 10 2013 208 528.1 filed May 8, 2013, the contents of which are hereby incorporated by reference in their entirety.

TECHNICAL FIELD

The present invention relates to a method for determining the opening and/or closing time of the nozzle needle of an injection valve of an internal combustion engine having a plurality of cylinders, in which method the nozzle needle is actuated directly by means of a piezo actuator.

BACKGROUND

In known injection systems, the nozzle needle of the respective injection valve is actuated by means of a piezo actuator. When an electrical voltage is applied to the piezo actuator, the latter increases its length with the result that in this way the position of the nozzle needle of the injection valve can be controlled. For such injection valves, very stringent requirements are made of the accuracy and robustness of the injection quantity under all operating conditions and over the entire service life of the respective vehicle.

In order to identify the nozzle needle position during the actual injection process (active operation), feedback signals from the piezo actuator are used. The piezo actuator acts here as a sensor. This information is, however, subject to large interference variable influences because the piezo actuator is used simultaneously as an actuator and as a sensor. Interference variables relating to the feedback signal of the piezo actuator are generated, inter alia, by the actuation profile of the associated output stage for the application of current, by the idle stroke in the transmission of force between the piezo actuator and the nozzle needle, by friction effects in the region of the nozzle needle and by the actual stroke behavior of the piezo actuator. All these influences can act as interference variables on the feedback signals and therefore cause the connection of control variables for the correction of injection quantities to be falsified. These influences therefore reduce the robustness of the derived control variables and therefore also affect the quality of the control.

Previously, this problem has been solved by feedback evaluation algorithms for detecting the nozzle needle position using various threshold values from the electrical signals of the piezo voltage or piezo charge in order to carry out plausibility checking of the closing and/or opening information. However, in this context the robustness depends on the selected threshold values which, however, under certain circumstances cannot filter out all the possible embodiment failures or fault failures and therefore give rise to enduring, unacceptable residual faults.

SUMMARY

One embodiment provides a method for determining the opening and/or closing time of the nozzle needle of an injection valve of an internal combustion engine having a plurality of cylinders, in which method the nozzle needle is actuated directly by means of a piezo actuator, comprising the following steps: (a) measuring the piezo voltage and/or piezo charge at the respective piezo actuator, acting as a sensor, for the corresponding injection pulse in a plurality of cylinders of the internal combustion engine; (b) calculating the median value of the measured voltage values and/or charge values of the piezo actuators of the plurality of cylinders as a mean value of the cylinders for the corresponding injection pulse; and (c) using the obtained median value as an equivalent value for determining the opening and/or closing time when the needle opening and/or closing information cannot be detected or there is a fault.

In a further embodiment, the measurement and calculation of median values are carried out for all the cylinders of the internal combustion engine.

In a further embodiment, the measurement and the calculation of median values is carried out for each injection pulse.

In a further embodiment, the piezo capacitances are determined on the basis of the measured piezo voltage values and/or piezo charge values, the median value is calculated from the determined piezo capacitances and the median value which is obtained is used as an equivalent value.

In a further embodiment, the measured piezo voltage values and/or piezo charge values are additionally subjected to a filter function for the calculation of the opening and/or closing time of the nozzle needle.

BRIEF DESCRIPTION OF THE DRAWINGS

Example embodiments of the invention are discussed in detail below with reference to the drawings, in which.

DETAILED DESCRIPTION

Figure 1:
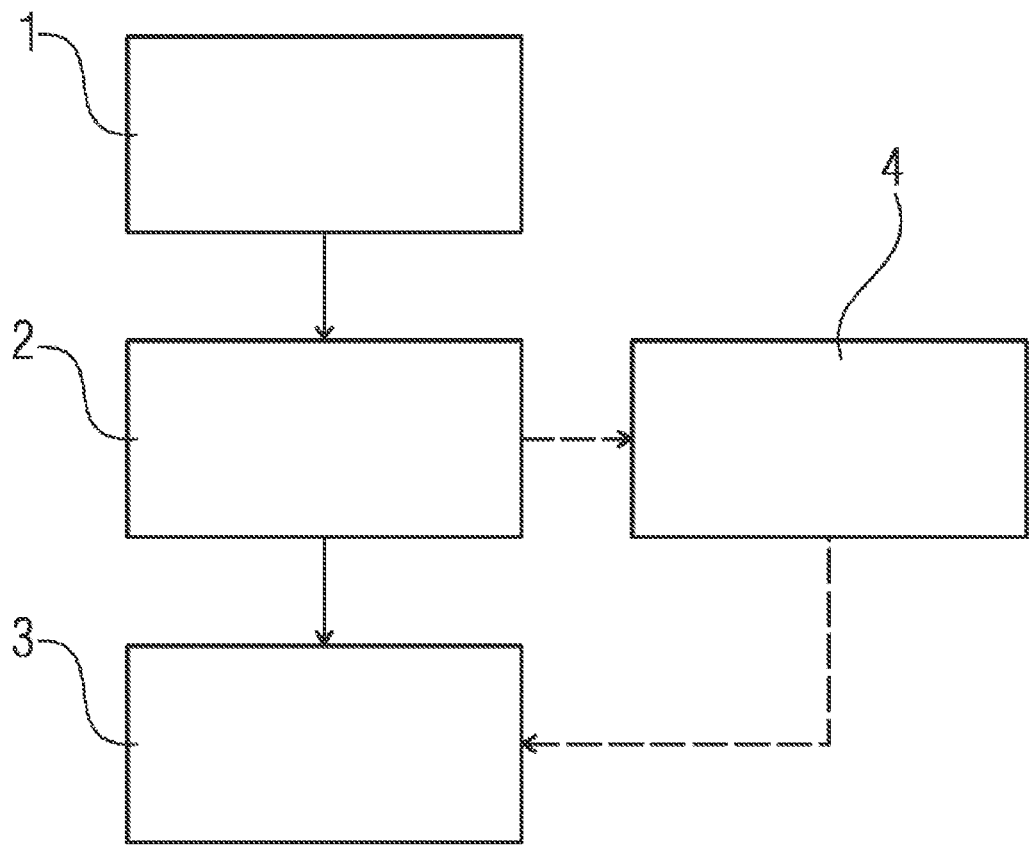
FIG. 1 shows a schematic basic illustration of the method according to the invention.

Embodiments of the present invention provide a method that permits, in the event of a fault, largely precise determination of the opening and/or closing time of the nozzle needle without substantially restricting the injection operation.

One embodiment provide a method of the type including:
a. Measuring the piezo voltage and/or piezo charge at the respective piezo actuator, acting as a sensor, for the corresponding injection pulse in a plurality of cylinders of the internal combustion engine;
b. Calculating the median value of the measured voltage values and/or charge values of the piezo actuators of the plurality of cylinders as a mean value of the cylinders for the corresponding injection pulse; and
c. Using the obtained median value as an equivalent value for determining the opening and/or closing time when the needle opening and/or closing information cannot be detected or there is a fault.

The disclosed method therefore provides a strategy for suppressing interference variables and calculating equivalent values of the feedback signals in order to increase or ensure the robustness over the service life of the injector element. Information received from other cylinders of the internal combustion engine is used to calculate the equivalent value. In particular, in this context plausibility checking is carried out with respect to the consideration of the mean profiles (median) over a plurality of cylinders of the corresponding injection pulse. In the event of a fault, it is therefore possible to calculate further with a median equivalent value without substantially restricting the injection operation.

By using this calculation and plausibility checking method, which is distinguished by the use of additional information sources, the robustness of injection functions and therefore of the resulting injection quantity can be significantly increased.

The calculation of an equivalent value is therefore carried out by means of the median value of a plurality of cylinders of the internal combustion engine and the corresponding injection pulse. When the corresponding needle position information cannot be detected from the existing signal profile or when there is a corresponding fault thereof, the determined equivalent value is connected.

One embodiment of the method according to the invention is distinguished in that the measurement and calculation of median values are carried out for all the cylinders of the internal combustion engine. In addition, in one preferred method, the measurement and the calculation of median values is carried out for each injection pulse. For the calculation of the median value, recourse is therefore made in these method variants to the information which is supplied by all the cylinders and all the injection pulses.

In a further preferred method variant, the piezo capacitances are determined on the basis of the measured piezo voltage values and/or piezo charge values, the median value is calculated from the determined piezo capacitances and the median value which is obtained is used as an equivalent value. In this method variant, a median value, specifically the median value of the capacitance, is therefore also preferably calculated as a mean value of a plurality of, in particular of all, the cylinders in a pulse-specific fashion. When the needle opening and/or closing information cannot be detected or when there is a fault therein, the determined median equivalent value of the capacitance is used to determine the opening and/or closing time of the nozzle needle.

In yet another embodiment of the method according to the invention, for the calculation of the opening and/or closing time of the nozzle needle the measured piezo voltage values and/or piezo charge values are additionally subjected to a filter function. Such a filter function is carried out for interference variable suppression, for example by means of a polynomial interpolation (polynomial fit) of the raw signals of the piezo voltage and piezo charge. In this context, for example, a deviation between the measured values and the polynomial fit values is determined and taken into account during the evaluation in order to minimize the corresponding interference variables.

The method described in the exemplary embodiment is used for determining the opening and/or closing time of the nozzle needle of an injection valve of an internal combustion engine having a plurality of cylinders, in which method the nozzle needle is actuated directly by means of a piezo actuator. According to FIG. 1, in a first method step the piezo voltage and the piezo charge are measured at the respective piezo actuator, acting as a sensor, for the corresponding injection pulse at all the cylinders of the internal combustion engine. In a second step, the median value of the measured voltage values and charge values of the piezo actuators of the cylinders is calculated as a mean value of all the cylinders for the corresponding injection pulse. In this way, an equivalent value is acquired. The median value which is obtained is used in step 3 as an equivalent value for determining the opening and/or closing time of the nozzle needle when detection is not possible or there is a fault in the needle opening and/or closing information.

In an alternative embodiment, the piezo capacitances are determined from the measured piezo voltage values and piezo charge values (step 4), and the median value is calculated from the determined piezo capacitances. The median value which is obtained is then used as an equivalent value.

An equivalent value is therefore calculated by means of the median of all the cylinders and for each pulse, wherein in the event of corresponding non-detectability or a fault this equivalent value is connected in order to determine the opening and/or closing time of the nozzle needle.

Figure 2:
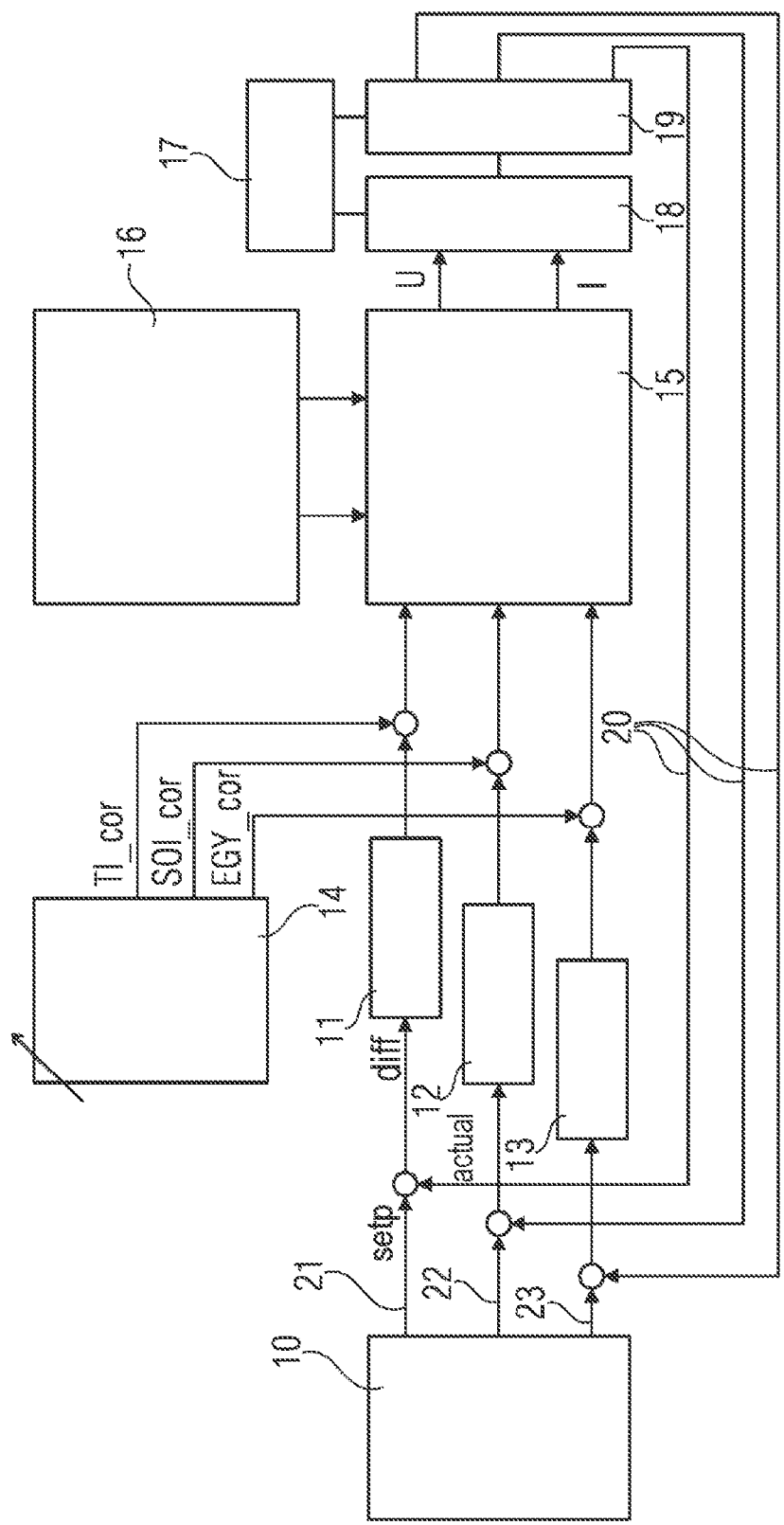
FIG. 2 shows a detailed schematic illustration of the method from FIG. 1.

FIG. 2 shows a more detailed illustration of this feedback equivalent value calculation. According to block 10, the corresponding setpoint values for the closing time (path 21), the opening time (path 22) and the contact force (path 23) of the nozzle needle are input. Corresponding closing time control units, opening time control units and contact force control units are denoted by 11, 12 and 13. By means of an adaptive pilot control compensation system 14, corresponding correction values are input for the injection time, the start of injection and the injection energy. The corresponding controlled system for an injector is denoted by 15. Corresponding interference variables which influence the control are indicated by the block 16. These are internal and/or external interference variables.

In block 18, the piezo voltage and piezo charge of the associated piezo actuator, acting as a sensor, of the injectors of all the cylinders are measured for the corresponding injection pulse using a decision logic 17. On the basis of these values, a median value is calculated as a mean value of the cylinders for the corresponding injection pulse which is fed back again to the paths 21, 22 and 23 as a feedback signal 20 for the closing time, needle opening time and contact force by means of a corresponding detection algorithm, in order to function as an equivalent value for the closing time, opening time and contact force if these cannot be detected.

What is claimed is:

1. A method for determining a nozzle needle opening time or closing time of in an internal combustion engine having a plurality of cylinders, each having a corresponding injection valve having a nozzle needle that is actuated directly by a respective piezo actuator, the method comprising:
    for at least some of the plurality of cylinders, measuring a piezo voltage value or a piezo charge value at the piezo actuator of the injection valve corresponding to the respective cylinder during an injection pulse;
    calculating a median value of the plurality of measured piezo voltage values or piezo charge values of the piezo actuators of the plurality of cylinders as a mean value of the cylinders for a corresponding injection pulse; and
    in response to detecting a fault, using the calculated median value as an equivalent value for determining at least one of an opening time or a closing time of a particular nozzle needle.

2. The method of claim 1, comprising performing the measurement and calculation of median values for all the cylinders of the internal combustion engine.

3. The method of claim 1, comprising performing the measurement and the calculation of median values for each of a plurality of injection pulses.

4. The method of claim 1, comprising:
  determining piezo capacitances based on the measured piezo voltage values or piezo charge values,
  calculating the median value from the determined piezo capacitances, and
  using the calculated median value as an equivalent value.

5. The method of claim 1, comprising applying a filter function to the measured piezo voltage values or the piezo charge values for the calculation of the opening time or closing time of the nozzle needle.

6. The method of claim 1, wherein measuring a piezo voltage value or a piezo charge value comprises measuring a piezo voltage value and a piezo charge value at the piezo actuator.

7. An injection system for an internal combustion engine, comprising:
  a plurality of injection valves, each corresponding to a cylinder of the internal combustion engine and including a nozzle needle that is actuated directly by a respective piezo actuator,
  a control unit configured to:
    for at least some of the plurality of cylinders, measure a piezo voltage value or a piezo charge value at the piezo actuator of the injection valve corresponding to the respective cylinder during an injection pulse;
    calculate a median value of the plurality of measured piezo voltage values or piezo charge values of the piezo actuators of the plurality of cylinders as a mean value of the cylinders for a corresponding injection pulse; and
    in response to detecting a fault, use the calculated median value as an equivalent value for determining at least one of an opening time or a closing time of a particular nozzle needle.

8. The injection system of claim 7, wherein the control unit is configured to perform the measurement and calculation of median values for all the cylinders of the internal combustion engine.

9. The injection system of claim 7, wherein the control unit is configured to perform the measurement and the calculation of median values for each of a plurality of injection pulses.

10. The injection system of claim 7, wherein the control unit is configured to:
  determine piezo capacitances based on the measured piezo voltage values or piezo charge values,
  calculate the median value from the determined piezo capacitances, and
  use the calculated median value as an equivalent value.

11. The injection system of claim 7, wherein the control unit is configured to apply a filter function to the measured piezo voltage values or the piezo charge values for the calculation of the opening time or closing time of the nozzle needle.

\* \* \* \* \*